United States Patent
Bolander et al.

(10) Patent No.: US 8,553,428 B2
(45) Date of Patent: Oct. 8, 2013

(54) COMPONENT FOR REDUCING MECHANICAL STRESS ON A PCB

(75) Inventors: Lars Bolander, Mölndal (SE); Tomas Bergsten, Rångedal (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 461 days.

(21) Appl. No.: 12/601,623

(22) PCT Filed: May 24, 2007

(86) PCT No.: PCT/SE2007/050356
§ 371 (c)(1),
(2), (4) Date: Nov. 24, 2009

(87) PCT Pub. No.: WO2008/143565
PCT Pub. Date: Nov. 27, 2008

(65) Prior Publication Data
US 2010/0182759 A1    Jul. 22, 2010

(51) Int. Cl.
*H05K 7/02*    (2006.01)
*H05K 7/04*    (2006.01)

(52) U.S. Cl.
USPC .......... 361/807; 361/705; 361/760; 361/763; 361/810

(58) Field of Classification Search
USPC ......... 361/807–810, 766, 760–763, 700–710, 361/803
See application file for complete search history.

(56) References Cited

U.S. PATENT DOCUMENTS

| 4,658,331 | A | * | 4/1987 | Berg | 361/705 |
| 4,744,009 | A | * | 5/1988 | Grabbe et al. | 361/749 |
| 5,099,392 | A | * | 3/1992 | Miller et al. | 361/760 |
| 5,262,925 | A | * | 11/1993 | Matta et al. | 361/783 |
| 5,653,599 | A | * | 8/1997 | Stratas | 439/73 |
| 5,667,388 | A | * | 9/1997 | Cottrell | 439/74 |
| 5,770,891 | A | * | 6/1998 | Frankeny et al. | 257/727 |
| 5,793,618 | A | * | 8/1998 | Chan et al. | 361/809 |
| 6,181,567 | B1 | * | 1/2001 | Roemer et al. | 361/760 |
| 2004/0068867 | A1 | | 4/2004 | Burton | |

FOREIGN PATENT DOCUMENTS

| EP | 0451363 | 10/1991 |
| JP | 2006253580 | 9/2006 |

* cited by examiner

*Primary Examiner* — Tuan T Dinh

(57) ABSTRACT

A component for mounting on a PCB, intended to support an electronics component, with an extension in the longitudinal, lateral and vertical directions. The component has a first and a second main surface, the second main surface being intended for mounting on the PCB. The component is made in a non conducting material, with a first layer of conducting material arranged on its first main surface, the conducting layer being connected to a conducting layer on the second main surface of the component by electrically conducting means. The component's extension in the vertical direction is smaller than its extension in either the longitudinal or lateral direction.

9 Claims, 5 Drawing Sheets

COMPONENT FOR REDUCING MECHANICAL STRESS ON A PCB

TECHNICAL FIELD

The present invention discloses a component and an assembly by means of which stress in an electronics component due to, for example, heat variations and vibrations or shock may be absorbed.

BACKGROUND

When using electronics components which are made of, for example, ceramic materials, and mounting such components on Printed Circuit Boards, PCBs, differences in thermal expansion factor between the PCB and the component can cause damage to the component, and may in some cases cause the component to break. Also, vibrations due to, for example, shock, may cause damage to the component if the PCB is not able to absorb the shock or vibrations properly.

U.S. Pat. No. 6,310,759 discloses a device by means of which thermal and mechanical stress may be absorbed by a ceramic capacitor. However, it appears that this device is only capable of absorbing stress in one direction, or from one side of the device.

SUMMARY

As has emerged from the explanation given above, it is important to be able to mount an electronics component to a PCB in a way which will make it possible for the component to endure thermal expansion or contraction in the PCB, as well as isolating the component from shock or vibrations caused to the PCB.

A solution to this problem should also be able to absorb thermal or mechanical stress in more than one direction, or from more than one side, and should be possible to use in a standard pick and place machine.

A solution to this is offered by the present invention in that it provides a component for mounting on a Printed Circuit Board, a PCB, the component being intended to support an electronics component.

The component of the invention has an extension in each of the longitudinal, lateral and vertical directions with reference to how the component is intended to be mounted on a PCB, and also has a first main surface and a second main surface, with the second main surface being intended for mounting on a main surface of the PCB. The component of the invention is made of a non conducting material, and has a first layer of conducting material arranged on at least part of its first main surface of the component.

The conducting layer of the component is connected to a second conducting layer on the second main surface of the component by electrically conducting means, and the extension of the component in the vertical direction is smaller than its extension in either of the longitudinal or lateral extensions. The component also exhibits a through-going aperture from the first main surface to the second main surface.

The component's extension in the vertical direction is preferably less than or equal to 0.6 millimeters, but suitably the vertical extension may also be less than 0.3 millimeters.

Thus, in effect, as will be seen even more clearly from the following detailed description, the invention provides a frame for mounting an electronics component on a PCB, the frame being such that it can flex in at least one of the lateral and longitudinal directions, as well as in the vertical direction, by means of which the frame can absorb expansions and contractions and shock in those directions.

As will be realized from the following detailed description, the component of the invention can easily be used by standard pick and place machines.

The invention also discloses an assembly comprising a frame essentially as the one described above, with an electronics component mounted on it.

BRIEF DESCRIPTION OF THE DRAWINGS

The invention will be described in more detail in the following with reference to the appended drawings, in which.

DETAILED DESCRIPTION

Figure 1:
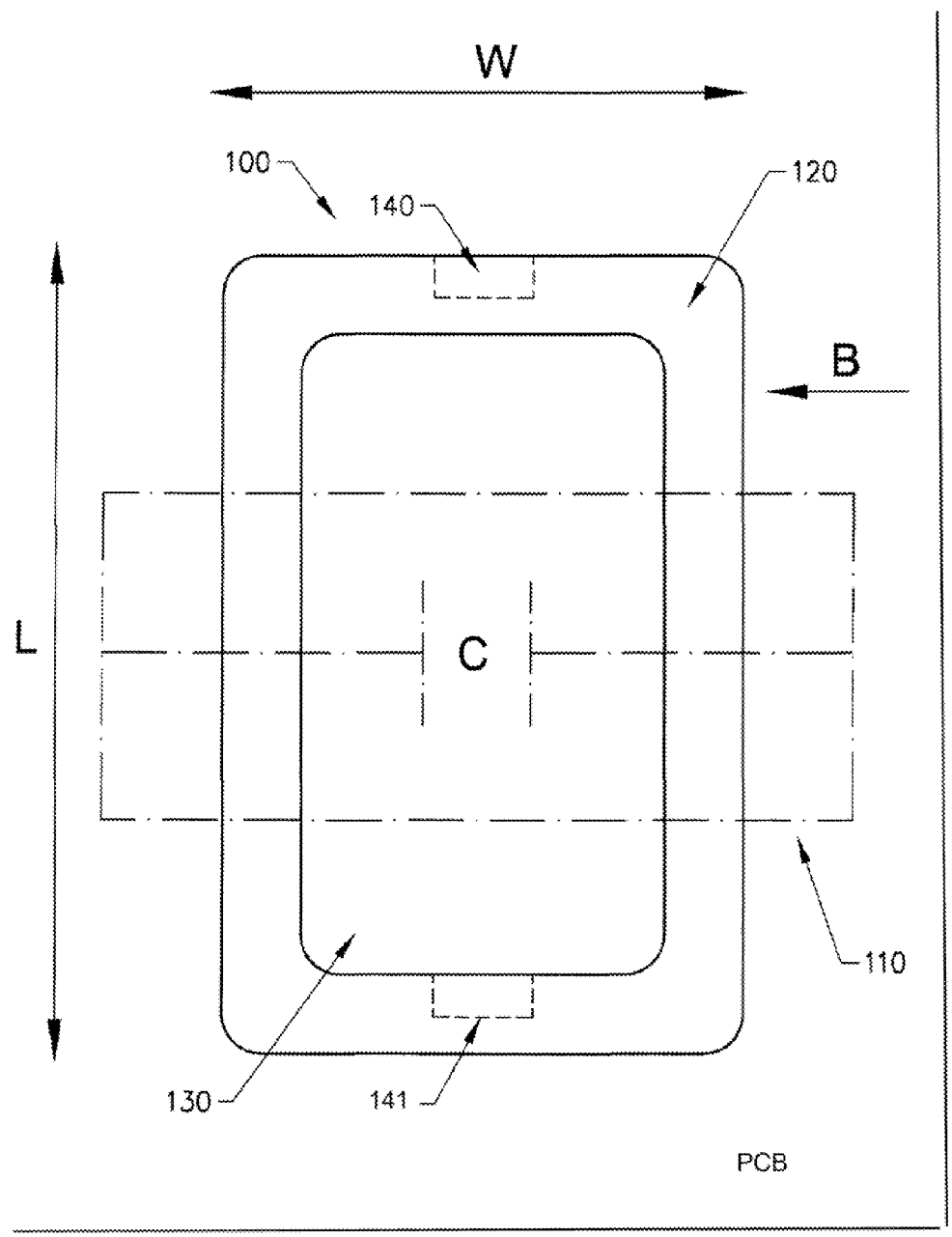
FIG. 1 shows a top view of a component of the invention.

FIG. 1 shows a top view of a component 100 of the invention in a basic first embodiment. As can be seen, the component 100 in this embodiment has an extension in the lateral direction, shown as W in FIG. 1, as well as an extension in the longitudinal direction, shown as L in FIG. 1. The terms lateral and longitudinal are not used here in order to restrict the invention in any way, but are merely terms used to facilitate the reader's understanding of the invention. However, for ease of understanding, it will from now on be assumed that the terms longitudinal and lateral are with reference to how the component is intended to be mounted on a PCB.

As will be realized, the component 100 also has an extension in the vertical direction, the term vertical here being used to refer to a direction which is essentially perpendicular to the surface of the PCB on which the component is intended to be arranged.

The component 100 has a first main surface, shown as 120 in FIG. 1, as well as a second main surface which is not shown in FIG. 1, but which is the rear surface of the component, and essentially corresponds to the first main surface 120 of the component 100.

The component is intended for supporting an electronics component, such a component 110 being shown in FIG. 1 with dashed lines. The first main surface 120 of the component 100 is the one on which the electronics component 110 is intended to be mounted, as can be seen from FIG. 1, and the second main surface of the component is the one intended for mounting on a PCB.

The component 100 is intended to "absorb" contractions, expansions and shock in at least two directions, so that an electronics component 110 which is arranged on a PCB via the component 100 will not sustain damage.

In FIG. 1, a shock or expansion/contraction in one direction is shown by the arrow marked "B", i.e. a shock or movement perpendicular to the longitudinal extension of the component 100. In order for the component 100 to be able to absorb a force in the direction "B", the component 100 is designed with a through-going hole 130 in the vertical direction, in effect making the component 100 into a frame on which an electronics component 110 can be arranged. The aperture or hole 130 enables the component 100 to flex in the direction B in such a way that it "isolates" the electronics component 110 from the force in the direction B.

Also shown in FIG. 1 are attachment points 140, located on the second main surface of the component 100, and intended to be used when placing the component 100 on a PCB, so that the component 100 may be soldered to the PCB.

In FIG. 1, the frame 100 is shown with an elongated form, i.e. the extension in one of the lateral or longitudinal directions is greater than the other, but this is merely one example of an embodiment. The component 100 will also function with other proportions between said two extensions, i.e. the lateral and longitudinal directions.

Figure 2A:
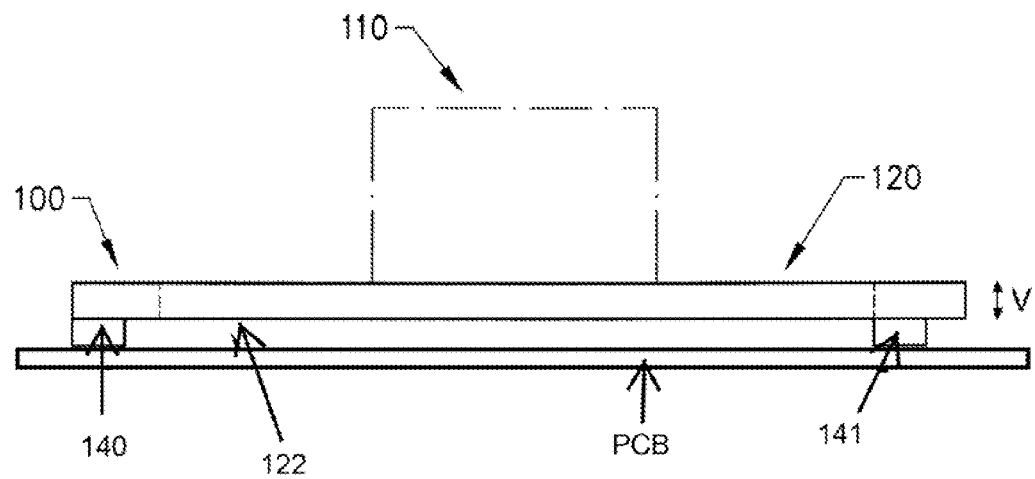
FIG. 2 shows two side views of the component of FIG. 1.

As mentioned previously, the component 100 is also intended to be able to absorb movements or stress in the vertical direction. This is shown in more detail in FIG. 2a: FIG. 2a shows the same as FIG. 1, but seen from one of the sides of the component 100, for example from the longer side, i.e. from the direction of the arrow "B". The reference numbers from FIG. 1 have been used in FIGS. 2a and 2b as well in order to denote the same components, parts or features, and the reference numeral 122 has been added to refer to the second main surface of the component 100.

An arrow "V" is used to illustrate the vertical direction of the component 100. The attachment points 140 shown in FIG. 1 are also shown in FIG. 2a, for the sake of clarity.

Figure 2B:
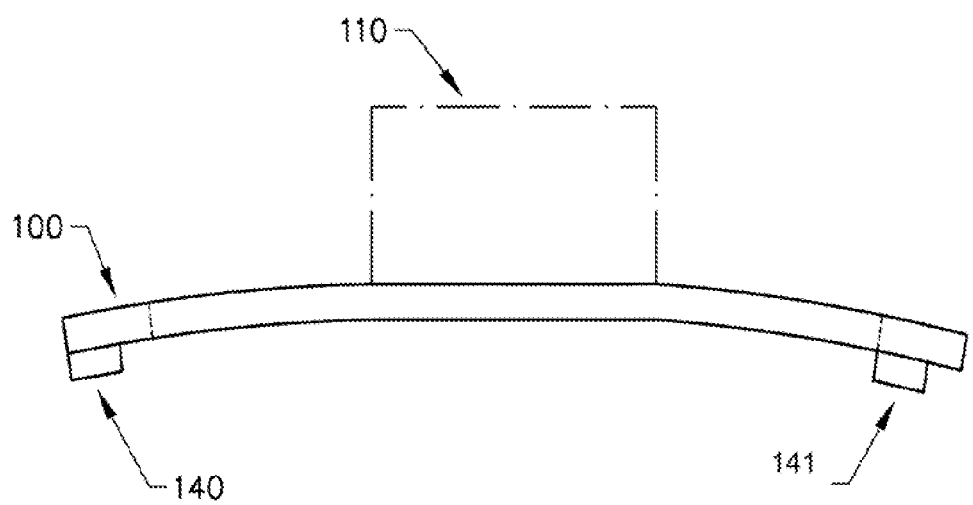

FIG. 2b shows the component 100 when subjected to a stress or vibration or shock or the like in the vertical direction V. As shown in FIG. 2b, the component 100 is designed so that it can "flex" in the vertical direction, this isolating the electronics component 110 from this stress. In order for the component 100 to be able to perform the flexing movement shown in FIG. 2b, the component 100 should not have a vertical extension which is too great. A suitable range of values has been found to be a vertical extension below 0.6 millimeters, although in some embodiments it has been preferred to make the component 100 with a vertical extension which is less than 0.3 millimeters.

However, regarding the vertical extension of the component 100, it has also been found in some applications that it is useful to define the vertical extension as well as the longitudinal and lateral extensions as being such that in an assembly comprising the component 100 and an electronics component 110, the component 100 exhibits a greater flexibility than the electronics component 110 in the vertical direction and one direction perpendicularly across the assembly, i.e. one of the longitudinal and lateral extensions More will be said later about how the electronics component is electrically connected to a PCB via the component 100, but it can be pointed out here that the component 100 should be manufactured in a non conducting material, such as, for example, FR 4 or PTFE.

So far, it has been shown how a component of the invention may be designed so as to absorb contraction/expansion by the electronics component in one of the longitudinal and lateral directions, as well as in the vertical direction. However, it is also possible to enable the component of the invention to absorb stress in both of the longitudinal and lateral extensions, as well as in the vertical direction.

Figure 3:
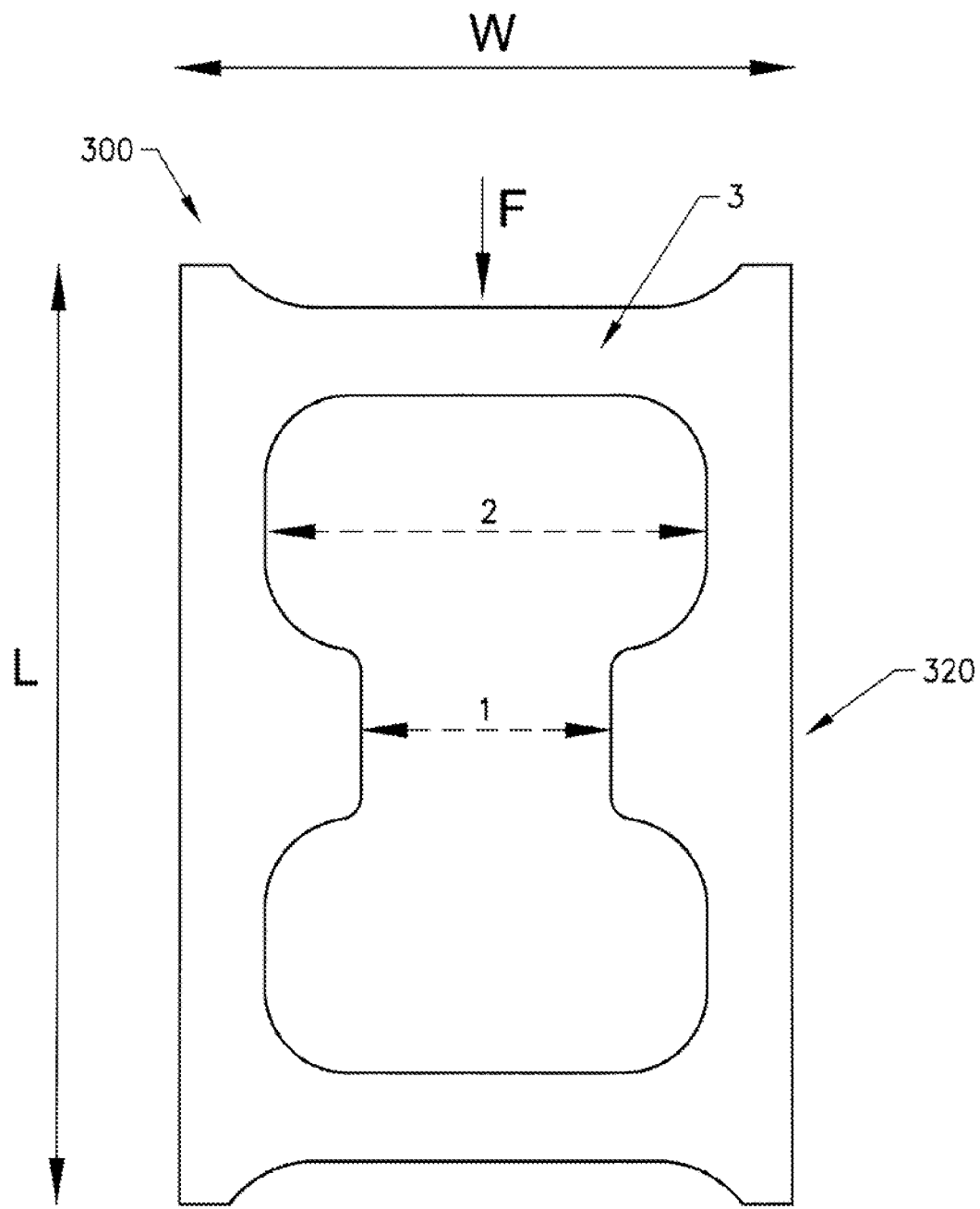
FIG. 3 shows a top view of an alternative component of the invention.

An embodiment 300 of the component of the invention which will fulfill this function is shown in FIG. 3. The features of the component shown in FIGS. 1 and 2a and 2b will not be shown in FIG. 3, but it is assumed that all of these features are present in the embodiment in FIG. 3, and that the alternatives mentioned above are also possible for the embodiment 300 of FIG. 3.

The embodiment 300 is thus intended to be able to absorb stress not only in the two directions shown in FIGS. 1 and 2a and 2b, but also in a third direction, shows with an arrow "F" in FIG. 3, which is a direction which is essentially perpendicular to the direction of the arrow "B" in FIG. 1, as well as being perpendicular to the vertical direction "V". It can be pointed out here that the components shown in FIGS. 1, 2a, 2b and 3 are also able to absorb stress in directions which are not so directly perpendicular as the arrows F, B and V shown, stress and vibrations can be absorbed in directions which comprise combinations of those directions, thus making the stress non-perpendicular to one or more of the sides or main surfaces of the component of the invention.

Turning now to the embodiment 300 shown in FIG. 3, it can be seen that in this embodiment, the component 300 is designed with a "waist", i.e. two opposing edges of the component do not have a constant distance between them, as opposed to the embodiment shown in FIG. 1. In the example in FIG. 3, it is the longitudinal edges that match this description.

The "waist" feature can also be expressed as saying that if, for example, the longitudinal sides are those that exhibit the "waist", the shortest distance across the component 300 at a first point 1 is smaller than the shortest distance across the component at a second point 2 between said first point and the longitudinal end 3 of the component 300.

The waist will enable the component 300 to absorb stress in the direction indicated by means of the arrow "F" in FIG. 3, as well as in the two directions described earlier and also shown in FIGS. 1, 2a and 2b.

It will be realized that the concept of a "waist" in the component of the invention can be designed in many different ways within the scope of the present invention. For example, the edges of the component 300 which are shown as essentially straight in FIG. 3, i.e. the lateral sides, which coincide with the direction of the arrow "W" in FIG. 3, can also be equipped with "waists".

Furthermore, a waist can be created by making only one of the edges curved, as opposed to making two opposing edges concave, as shown in FIG. 3. In addition, there may be waists within edges that have waists.

Also, in another embodiment of the invention, the shortest distance across the component 300 at a first point 1 is made larger than the shortest distance across the component at the second point 2 between said first point and the longitudinal end 3 of the component 300. The desired effect is essentially obtained in this way as well.

Figure 4:
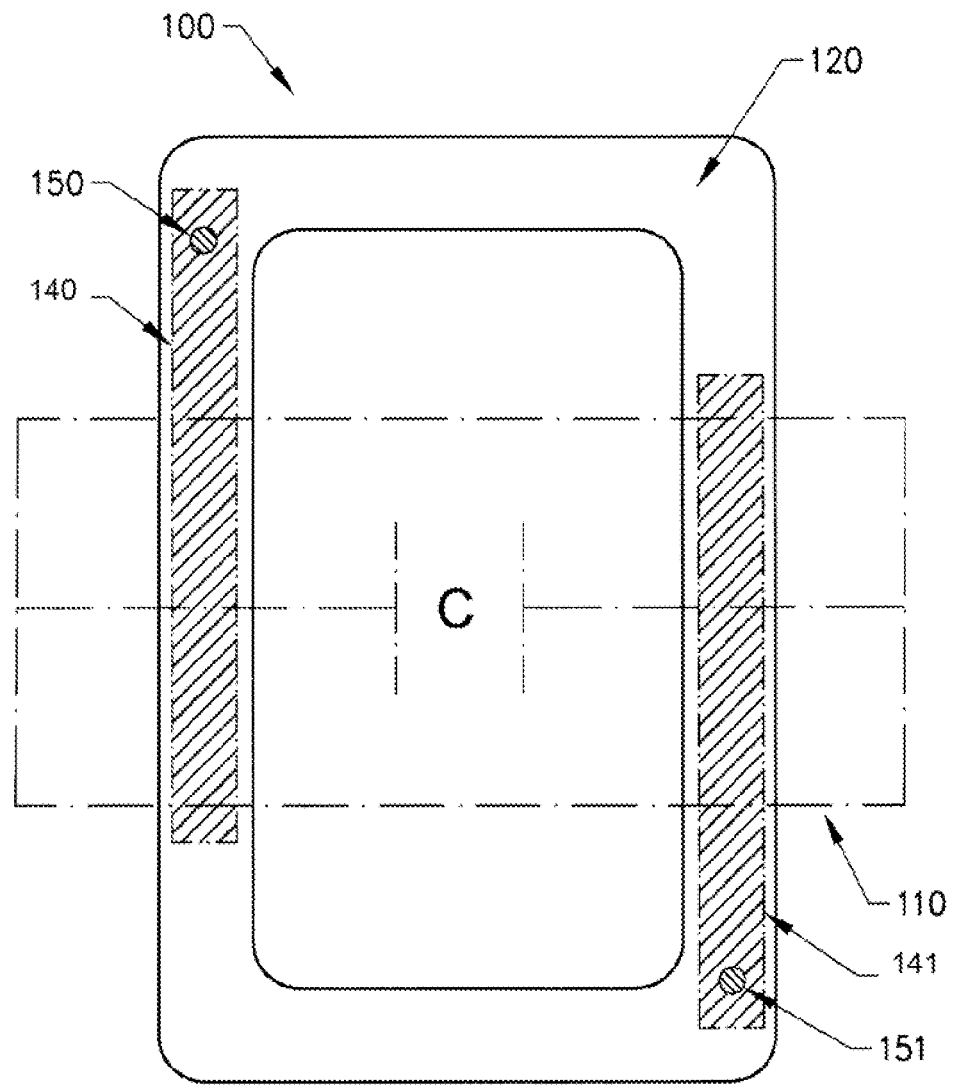
FIG. 4 shows a more detailed top view of a component of the invention.

Turning now to the electrical connection of the electronics component 110 to a PCB by means of a component of the invention 100, 300, FIG. 4 illustrates this. Features or parts which have already been given reference numbers in previous figures have retained their reference numerals in FIG. 4.

As has been pointed out previously, the component 100 is made from a non conducting material, such as, for example, FR4 or PTFE. The component 110 which is to be arranged on the first main surface 120 of the component 100 thus needs to have a conducting connection to the second main surface 122 of the component, which is the surface that is intended for mounting on a PCB. Accordingly, there is a first layer 140, 141 of conducting material arranged on at least part of the first main surface 120 of the component 100, which in FIG. 4 is shown as two separate patches 140, 141, of conducting material on the first main surface 120 of the component.

The first layer of conducting material 140, 141 is connected to a second conducting layer on the second main surface 122 of the component 100 by electrically conducting means such as, for example, plated via holes, shown as 150 and 151 in FIG. 4. Naturally, the number of conducting means such as via holes and patches shown in FIG. 4 are merely examples, the number of such means can be varied more or less freely within the scope of the present invention. Alternatives to the plated via holes 150, 151, can, for example, be edge plating or wiring.

It can be pointed out that the position of the first conducting layer 141, 141 on the first main surface 120 of the component should be such that they coincide with the positions of "contact points" on the component 110, if there are distinct such points on the component.

Figure 5:
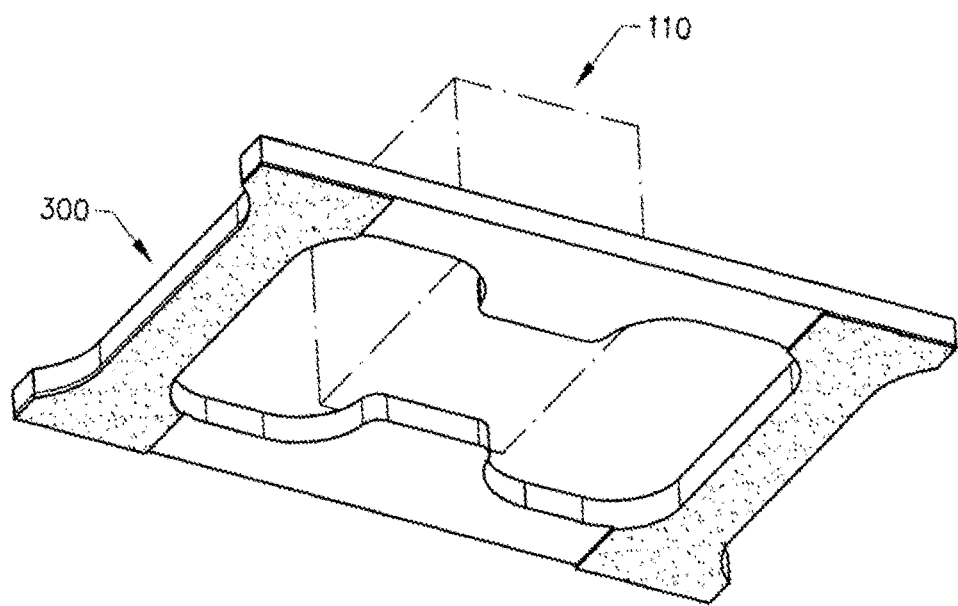
FIG. 5 shows a view of an assembly of the invention.

Finally, FIG. 5 shows a side view from below of an assembly of the invention, with an electronics component 110 arranged on the component 300 from FIG. 3.

The invention is not restricted to the examples of embodiments shown in the drawings and described above, but may be freely varied within the scope of the appended claims.

For example, it can be pointed out that although the electrical component which can be mounted on a PCB by means of the invention can be a component of more or less any kind, i.e. an IC chip, a resistor, a capacitance, an inductance or any combination of these, although the component 110 for the reader's understanding has been shown with the letter "C" throughout the drawings.

It should also be pointed out that the invention relates to the component 100, 300 as such, as well as to a complete assembly, i.e. the component 100, 300, with an electronics component arranged on it, for example as shown in FIG. 5.

The invention claimed is:

1. A component for mounting on a printed circuit board (PCB) said component being intended to support an electronics component and absorb thermal and/or mechanical stress in the PCB, the component comprising:
   an extension in each of the longitudinal, lateral and vertical directions with reference to how the component is mounted on a PCB,
   a first main surface and a second main surface, wherein said electronics component is mounted in direct contact on said first main surface, and wherein said second main surface is mounted on a main surface of the PCB,
   wherein the component is made in a non conducting material, with a first layer of conducting material arranged on at least part of said first main surface of the component, said first conducting layer being connected to a second conducting layer on the second main surface of the component by electrically conducting means,
   wherein the extension in the vertical direction is smaller than the extension in either of the longitudinal or lateral extensions,
   wherein the component exhibits a through-going aperture from the first main surface to the second main surface;
   wherein the component flexes in at least one of the lateral, longitudinal, and vertical directions in response to at least one of contractions, expansions, and shock in the PCB, said flexing preventing damage to the electronics component; and
   wherein the sides of the component extending in the longitudinal direction exhibit a "waist", such that a shortest lateral distance across the component at a first point is smaller than a shortest distance across the component at a second point between said first point and a longitudinal end of the component.

2. The component of claim 1, wherein extension in the vertical direction is less than or equal to 0.6 millimeters.

3. The component of claim 1, wherein its extension in the vertical direction is less than or equal to 0.3 millimeters.

4. The component of claim 1, wherein the area of the aperture is larger than the area of the first main surface.

5. The component of claim 1, wherein the extension in the longitudinal direction is greater than the extension in the lateral direction.

6. An assembly comprising:
   an electronics component arranged on a second component,
   said second component mounting the assembly on a printed circuit board (PCB),
   said second component having an extension in each of the longitudinal, lateral and vertical directions with reference to how the assembly mounted on the PCB,
   the second component also having a first main surface and a second main surface, wherein said electronics component is mounted in direct contact on said first main surface, and wherein said second main surface is mounted on a main surface of the PCB,
   wherein the second component is made in a non conducting material, with a first layer of conducting material arranged on at least part of said first main surface of the second component, said first conducting layer being connected to a second conducting layer on the second main surface of the second component by electrically conducting means,
   wherein the second component exhibits a through-going aperture from the first main surface to the second main surface, such that the area of the aperture is larger than the area of the first main surface,
   wherein the second component exhibits a greater flexibility than the electronics component in the vertical direction and one direction perpendicularly across the assembly;
   wherein the second component flexes in at least one of the lateral, longitudinal, and vertical directions in response to at least one of contractions, expansions, and shock in the PCB, said flexing preventing damage to the electronics component; and
   wherein the sides of the second component extending in the longitudinal direction exhibit a "waist", such that a shortest lateral distance across the component at a first point is smaller than a shortest distance across the component at a second point between said first point and a longitudinal end of the component.

7. The assembly of claim 6, further wherein the extension of the second component in the vertical direction is less than or equal to 0.6 millimeters.

8. The assembly of claim 6, further wherein the extension of the second component in the vertical direction is less than or equal to 0.3 millimeters.

9. The assembly of claim 6, wherein the extension of the second component in the longitudinal direction is greater than its extension in the lateral direction.

* * * * *